(12) United States Patent
Pradhan et al.

(10) Patent No.: US 11,916,367 B2
(45) Date of Patent: Feb. 27, 2024

(54) METHOD AND DEVICE FOR ESTIMATING SOURCE IMPEDANCES ACROSS ONE OR MORE TRANSMISSION LINES

(71) Applicant: Hitachi Energy Switzerland AG, Baden (CH)

(72) Inventors: Vedanta Pradhan, Bhubaneswar (IN); Od Naidu, Karnataka (IN)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/475,972

(22) Filed: Sep. 15, 2021

(65) Prior Publication Data
US 2022/0085594 A1 Mar. 17, 2022

(30) Foreign Application Priority Data
Sep. 15, 2020 (IN) .............................. 202041039933

(51) Int. Cl.
*H02H 3/00* (2006.01)
*G01R 19/25* (2006.01)
*G01R 31/08* (2020.01)

(52) U.S. Cl.
CPC ......... *H02H 3/006* (2013.01); *G01R 19/2513* (2013.01); *G01R 31/085* (2013.01)

(58) Field of Classification Search
CPC .. H02H 3/006; G01R 19/2513; G01R 31/085; G01R 31/088; G01R 31/08; G01R 27/08
See application file for complete search history.

(56) References Cited

U.S. PATENT DOCUMENTS

| | | | |
|---|---|---|---|
| 4,559,491 A | 12/1985 | Saha | |
| 6,584,417 B1 * | 6/2003 | Hu | G01R 31/085 |
| | | | 361/522 |

(Continued)

FOREIGN PATENT DOCUMENTS

| | | |
|---|---|---|
| DE | 294349 A5 | 9/1991 |
| JP | S61-11673 A | 1/1986 |

(Continued)

OTHER PUBLICATIONS

Extended European Search Report for corresponding EP Application No. 20211743.8 dated May 21, 2021, 10 pages.

(Continued)

*Primary Examiner* — Feba Pothen
(74) *Attorney, Agent, or Firm* — PROCOPIO CORY HARGREAVES AND SAVITCH LLP

(57) ABSTRACT

The present invention relates to estimating source impedances across one or more transmission lines connecting at least two substations. Each substation is associated with an equivalent source having a respective source impedance. Voltage and current measurements and status signals are obtained. The voltage and current measurements provide terminal or bus voltages and line currents at each terminal, and the status signals are associated with switching events at the one or more transmission lines or at the substations. An event associated with a disturbance or current injection is detected from one or more of the obtained measurements and the obtained status signals. The source impedance of each equivalent source is estimated based on the event, using line parameters and the voltage and current measurements associated with the event.

22 Claims, 14 Drawing Sheets

(56) References Cited

U.S. PATENT DOCUMENTS

| | | | |
|---|---|---|---|
| 8,050,878 | B2 | 11/2011 | Dougherty et al. |
| 2014/0371929 | A1 | 12/2014 | Allen et al. |
| 2016/0116522 | A1 | 4/2016 | Abido et al. |
| 2017/0117936 | A1* | 4/2017 | Fertner .................... H04B 3/46 |
| 2018/0316183 | A1* | 11/2018 | Naidu .................... H02H 7/263 |

FOREIGN PATENT DOCUMENTS

| | | | |
|---|---|---|---|
| JP | S61207130 | A | 9/1986 |
| JP | H6-70449 | A | 3/1994 |
| JP | H08122395 | A * | 5/1996 |
| JP | 2001-16762 | A | 1/2001 |
| JP | 2017-17832 | A | 1/2017 |
| JP | 2017-208902 | A | 11/2017 |
| KR | 2013-0076490 | A | 7/2013 |
| WO | 2019/166903 | A1 | 9/2019 |
| WO | 2020/144150 | A1 | 7/2020 |

OTHER PUBLICATIONS

ABB AB, "Line distance protection REL670 Version 2.2 ANSI Application manual, RELION 670 Series", Document ID: 1MRK 506 369-UUS, Issued Jun. 2018, Revision:C, Product version: 2.2, 986 pages.

Apostolov et al . . . , "Power Swing And Out-Of-Step Considerations on Transmission Lines," IEEE PSRC WG D6, A report to the Power System Relaying Committee of the IEEE Power Engineering Society, Jul. 19, 2005, 59 pages.

Thompson et al., "A Tutorial on Calculating Source Impedance Ratios for Determining Line Length", Schweitzer Engineering Laboratories, Inc., Oct. 2014, 11 pages.

Eriksson, et al., An Accurate Fault Locator With Compensation For Apparent Reactance In The Fault Resistance Resulting From Remote-End Infeed, IEEE Transactions on Power Apparatus and Systems, vol. PAS-104, No. 2, Feb. 1985, IEEE Power Engineering Society, Power System Relaying Committee, 14 pages.

Mooney et al., "Application Guidelines for Ground Fault Protection", Oct. 1997, Schweitzer Engineering Laboratories, Inc., 47 pages.

Das Swagata et al., "Impedance-Based Fault Location in Transmission Networks: Theory and Application", IEEE Access, vol. 2, May 13, 2014, pp. 537-557, XP011549977, DOI: 10.1109/Access. 22014. 2323353, 21 pages.

Brahma, "New Fault-Location Method for a Single Multiterminal Transmission Line Using Synchronized Phasor Measurements", IEEE Transactions on Power Delivery, IEEE Service Center, New York, NY, US, vol. 21, No. 3, Jul. 1, 2006, pp. 1148-1153, XP011148961, ISSN: 0885-8977, DOI: 10.1109/TPWRD.2005. 860273, 6 pages.

Brahma, "New Fault Location Scheme fora Two-Terminal Transmission Line Using Synchronized Phasor Measurements", PES TD 2005/2006 May 21-24, 2006, Piscataway, NJ, USA, IEEE, Piscataway, NJ, USA, May 21, 2006, pp. 853-857, XP031331154, ISNG: 978-0-7803-9194-9, 5 pages.

Kwon et al., "A Fault Location Algorithm Using Estimated Local Source Impedance", Power Systems Conference and Exposition, 2009, PES ''09. IEEE/PES, IEEE, Piscataway, NJ, USA, Mar. 15, 2009, pp. 1-5, XP031450568, DOI: 10.1109/PSCE.2009.4840001, ISBN: 978-1-4244-3810-5, 5 pages.

Office action for corresponding IN Application No. 202041039933 dated Jun. 28, 2022, 7 pages.

* cited by examiner

METHOD AND DEVICE FOR ESTIMATING SOURCE IMPEDANCES ACROSS ONE OR MORE TRANSMISSION LINES

BACKGROUND

Embodiments of the present invention relate to power transmission systems. More specially, the embodiments relate to estimating source impedances across power transmission lines.

Various analyses in power transmission lines (e.g. analyses related to line protection) depend on an equivalent model of a power transmission system, for instance as seen from line terminals. Consider a double-circuit transmission line connected between terminal buses M and N. Typically, in interconnected high voltage transmission systems, each such line will be connected to the rest of the network through other transmission lines. Depending on operational requirements, shunt elements such as a reactor(s) or a capacitor(s) may also be connected at the buses. The load element may be a downstream lower voltage level network and/or a direct high tension (HT) load tapping.

Such an equivalent model may be used for setting the operational characteristics of distance relays. The model can also be used for setting power swing blinders and out of step logic as explained in "Power swing and out-of-step Considerations on transmission lines", IEEE PSRC WG D6, 2005.

Source impedances, which are the components of a typical equivalent model, are used to define the Source Impedance Ratio (SIR) of the line, which identifies whether it is a short, medium or long line for setting under/overreaching elements and designing pilot protection schemes as described in "A Tutorial on Calculating Source Impedance Ratios for Determining Line Length", M. J. Thomson, A. Somani, SEL, 2015.

Information of the source impedances becomes unavoidable for certain analyses such as locating a fault on the line when using only single ended measurements as explained in L. Eriksson, M. M. Saha and G. D. Rockefeller, "An Accurate Fault Locator with Compensation for Apparent Reactance in The Fault Resistance Resulting from Remote-End Infeed," in *IEEE Transactions on Power Apparatus and Systems*, vol. PAS-104, no. 2, pp. 423-436, February 1985.

The source impedances can be conveniently calculated if impedance matrix of the network ($Z_{BUS}$) is available as an input. If there are any changes in the network topology and if they are captured correctly, then the updated $Z_{BUS}$ can be used to recalculate the source impedances by this approach. However, at a substation level exercise, information of the entire network topology may not be available. Therefore, this method is of little help to a substation engineer/operator for finding the source impedances.

Different approaches have been explored to estimate the source impedances using only limited measurements in the vicinity of the line of concern.

In "Power swing and out-of-step considerations on transmission lines", IEEE PSRC WG D6, 2005, a method is presented which uses the information of the short circuit current levels at the end buses and the contribution to the fault currents from the line to approximately compute the source impedances. The limitation with this method is that it might be difficult to get the required data at both the buses concurrently unless one conducts or stages short circuit experiments at each bus.

A method is proposed in J. Mooney and J. Peer, "Application Guidelines for Ground Fault Protection", proceedings of the 24th Annual Western Protective Relay Conference, Spokane, Wash., October 1997, which suggests that a bolted short-circuit be performed at the IED bus (say bus 'M' of two terminal buses M and N). The nominal system voltage when divided by the adjusted fault current (i.e. fault current minus the contribution to the fault from the line) gives a measure of the source impedance of the IED bus.

The method proposed in "A Tutorial on Calculating Source Impedance Ratios for Determining Line Length", M. J. Thomson, A. Somani, SEL, 2015, advocates placing a short circuit at the remote end bus. Here, the drop in the IED bus voltage with respect to the nominal system voltage when divided by the current through the line gives the source impedance at the local bus.

In the U.S. Pat. No. 8,050,878 (B2), a difference between an upstream measured voltage during the open state of the line breaker and the local bus voltage on breaker closure is used to determine a network characteristic. The difference is divided by the post breaker closure line current to determine the network characteristic. The estimated network characteristic appears to be the impedance to the current due to a bolted short-circuit at a bus. Also, this method appears to be limited to breaker status-based calculation of such network characteristics. Additionally, for any status change event, the method appears to utilize measurements and therefore estimate the network characteristic at one location only. In other words, the method does not seem to relate to estimating source impedances associated with an equivalent model of a transmission line.

The prior art methods such as the ones described above are suitable for an approximate evaluation of magnitude values of the source impedance. However, estimating only the source impedance magnitude is not enough for certain functions (e.g. protection functions where angle plays major role). Moreover, the prior art methods may face the challenge that a fault must be created in the system during normal operation which may not be always feasible.

There is accordingly a need for an improved technique for estimating source impedances, where not only the magnitude, but also the angles are determined. Further, such a technique should eliminate the need for creating faults to determine the source impedances.

BRIEF DESCRIPTION

The present invention relates to improvements in estimating source impedances, which overcome at least some of the limitations of the prior art techniques.

An aspect of the invention provides a method for estimating source impedances across one or more transmission lines. The one or more transmission lines connect at least two substations. In accordance with different embodiments, the method can be implemented for transmission lines connecting two substations (i.e. two terminal lines). However, it may be possible to extend this to other transmission lines which have more than two terminals, for example having a common terminal connected to two other terminals (e.g. lines connecting a bus M to buses N and P, or lines connecting buses M and N to bus p). As an example, the power transmission system can be a three-phase system which connects two substations with parallel overhead lines. Each substation is associated with an equivalent source having a respective source impedance. The equivalent source can represent a combination of two or more transmission lines connected at the substation, a combination of a transmission line(s), a reactor(s) and/or a load(s), or a combination of various power sources/sub-systems.

The method comprises obtaining voltage and current measurements and status signals. The voltage and current measurements provide terminal (or bus) voltages and line currents at each substation. For instance, the measurements can be at each terminal (e.g. substation terminal or bus (busbar)) of the one or more transmission lines. The line currents include currents incident on, or currents circulated from a terminal. The line currents can also include currents through shunt elements. The status signals are associated with switching events at the one or more transmission lines or at the substations. These events can include, but need not be limited to, switching (on/off) of a line breaker(s), a breaker at a terminal, a shunt element(s) and so forth, where such switches can be provided on transmission lines or at the substations (e.g. connected at terminals).

The method further comprises detecting an event associated with a disturbance in one of the one or more transmission lines or associated with current injection at one of the substations (e.g. at a substation terminal (terminal) or busbar (bus)). For example, the event can be a disturbance such as a fault on one of the one or more transmission lines. Taking another example, the event is a fault at the terminal or bus. Taking yet another example, the event is switching (on/off) of a shunt element. Examples of the shunt element include, but are not limited to, a reactor, a capacitor and a load.

In accordance with various embodiments, the event is detected from one or more of the obtained measurements and the obtained status signals.

The method further comprises estimating the source impedance of each equivalent source based on the event. In accordance with different embodiments, the estimated source impedance has a complex value, i.e. has both magnitude and angle. Here, the source impedance is estimated using line parameters and the voltage and current measurements associated with the event, where the measurements associated with the event comprise the measurements before and after the event. The line parameters of a transmission line can comprise one or more of, but not limited to, characteristic impedance, propagation constant and line length of the transmission line.

In accordance with an embodiment, the disturbance is a fault on one of the one or more transmission lines. In accordance with the embodiment, estimating the source impedance of each equivalent source comprises:

- estimating a fault location on the transmission line;
- calculating a fault current using the estimated fault location;
- calculating two bus impedances, each bus impedance being associated with a respective terminal (i.e. substation terminal or busbar (bus)) of the one or more transmission lines, and calculated using a change in the terminal voltages of the corresponding terminal and the calculated fault current;
- calculating one or more of line and section impedances using the line parameters and the estimated fault location, wherein the section impedances are impedances of line sections located between the terminals and the estimated fault location; and
- estimating the source impedance of each equivalent source using one or more of the calculated line impedance and the calculated section impedances, and the two bus impedances.

In the above embodiment, calculating each bus impedance optionally comprises multiplying the bus impedance with a correction factor. Here, the correction factor is calculated using a ratio of a fault voltage and the calculated fault current, and shunt admittances of the line sections (i.e. line sections located between the terminals and the fault location). Here, the fault voltage is calculated using the estimated fault location, and the shunt admittances are calculated using the estimated fault location and the line parameters.

In addition, in the above embodiment, estimating the source impedance optionally comprises removing contribution of shunt admittance. Here, the contribution of shunt admittance is calculated using one or more of the shunt admittance of the at least one transmission line, and the shunt admittances of the line sections calculated using the fault location and the line parameters.

In accordance with an embodiment, there is current injection at one of the substations (e.g. at a substation terminal or bus), which is due to the disturbance being a fault on the bus (bus fault) or due to switching (on/off) of a shunt element. In accordance with the embodiment, estimating the source impedance of each equivalent source comprises:

- obtaining current injected at a terminal of the substation or the fault current from the current measurements obtained for the corresponding terminal;
- calculating two bus impedances, each bus impedance being associated with a respective terminal (i.e. the substation terminal or bus) of the one or more transmission lines, and calculated using a change in the terminal voltages of the corresponding terminal and the current injected or the fault current;
- calculating a line impedance using the line parameters; and
- estimating the source impedance of each equivalent source using the calculated line impedance and the two bus impedances.

In the above embodiment, the shunt element is one of a reactor, a capacitor and a load. Further, estimating the source impedance optionally comprises removing contribution of shunt admittance calculated using the line parameters.

The estimated source impedances can be utilized for adapting an equivalent model associated with at least one of a protection function and a control function. As an example, the estimated source impedance is used in configuring one of a protection function and a control function in a substation device.

The method can be implemented in a computer program product. Accordingly, in an embodiment, the invention provides a computer program product for estimating source impedances across one or more transmission lines. The computer program product comprises a non-transitory computer readable storage medium comprising instructions that, when executed by a processor, cause the processor to execute the method (i.e. part of or the entire method as per the case).

The method can be implemented with a power system or substation device. For example, the method can be implemented with a server. This server may be a substation server, or a remotely located server, which receives the obtained voltage and current measurements (e.g. from the measurement equipment, IEDs or relays) and the status signals (e.g. from the switching devices or relays). Taking another example, the method can be implemented with an Intelligent Electronic Device (IED), which has local end (terminal) voltage and current measurements and is communicatively coupled with an IED at the remote end. In this example, the IED also has the switching status (or status signals).

Accordingly, in an aspect the invention provides a device for estimating the source impedances across one or more transmission lines connecting at least two substations. In accordance with different embodiments, the device can be used in a two terminal line connecting two substations. However, the device may also be used in other configurations such as in the case of other transmission lines having more than two terminals, for example having a common terminal connected to two other terminals (e.g. lines connecting a bus M to buses N and P, or lines connecting buses M and N to bus p). As described above in conjunction with the method, each substation is associated with an equivalent source having a respective source impedance.

The device comprises a data acquisition unit configured to obtain voltage and current measurements and status signals, where the voltage and current measurements providing terminal voltages and line currents at each substation (e.g. at each terminal of the one or more transmission lines). The status signals are associated with switching events at the one or more transmission lines or at the substations.

The device further comprises a signal processing unit communicatively coupled to the data acquisition unit and configured to detect an event associated with a disturbance in one of the one or more transmission lines or current injection at one of the substations. Here, the signal processing unit is configured to detect the event from one or more of the obtained measurements and the obtained status signals. Alternately, the event may be detected by another unit/module and the event information can be provided as input to the signal processing unit (e.g. via the data acquisition unit).

The signal processing unit is also configured to estimate the source impedance of each equivalent source based on the event, using line parameters and the voltage and current measurements associated with the event. Here, the measurements associated with the event comprise the measurements before and after the event.

The device also comprises a control unit communicatively coupled to the signal processing unit. There may be a need to adapt an equivalent model due to changes in the source impedances. In such situations, the control unit is configured to adapt an equivalent model to perform at least one of a protection function and a control function based on the estimated source impedances. Alternately, the control unit may provide the updated source impedances as input for use in another substation device.

In an embodiment, the disturbance is a fault on the transmission line. In accordance with the embodiment, the signal processing unit is configured to:
  estimate a fault location on the transmission line;
  calculate a fault current using the estimated fault location;
  calculate two bus impedances, each bus impedance being associated with a respective terminal (i.e. substation terminal or bus) of the one or more transmission lines, and calculated using a change in the terminal voltages of the corresponding terminal and the calculated fault current;
  calculate one or more of line and section impedances using the line parameters and the estimated fault location, wherein the section impedances are impedances of line sections located between the terminals and the estimated fault location; and
  estimate the source impedance of each equivalent source using one or more of the calculated line impedance and the calculated section impedances, and the two bus impedances.

In the above embodiment, the signal processing unit can also be configured to calculate each bus impedance by multiplying the bus impedance with a correction factor, wherein the correction factor is calculated using a ratio of a fault voltage and the calculated fault current, and shunt admittances of the line sections (i.e. line sections located between the terminals and the fault location). Here, the fault voltage is calculated using the estimated fault location, and the shunt admittances are calculated using the estimated fault location and the line parameters.

Further, the signal processing unit can also be configured to estimate the source impedance by removing contribution of shunt admittance, wherein the contribution of shunt admittance is calculated using one or more of the shunt admittance of the at least one transmission line, and the shunt admittances of the line sections calculated using on the fault location and the line parameters.

In an embodiment, the current injection at one of the terminals is due to the disturbance being one of a fault on the bus or a switching of a shunt element. In accordance with the embodiment, the signal processing unit is configured to:
  obtain current injected at the terminal or fault current from the current measurements obtained for the corresponding terminal;
  calculate two bus impedances, each bus impedance being associated with a respective terminal (i.e. substation terminal or bus) of the one or more transmission lines, and calculated using a change in the terminal voltages of the corresponding terminal and the current injected at the terminal or the fault current;
  calculate a line impedance using the line parameters; and
  estimate the source impedance of each equivalent source using the calculated line impedance and the two bus impedances.

In the above embodiment, the signal processing unit can be configured to remove the contribution of shunt admittance of the transmission lines calculated using the line parameters.

DRAWINGS

DETAILED DESCRIPTION

Figure 1:
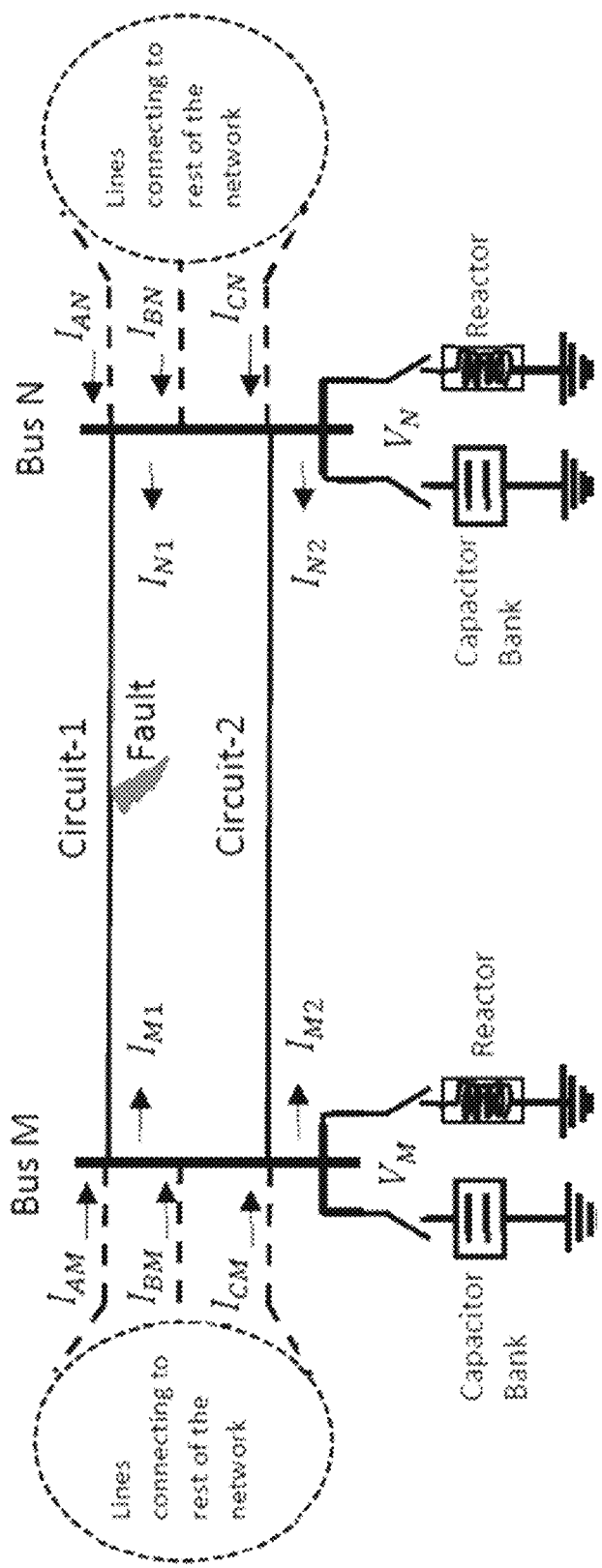
FIG. 1 is a schematic of a power transmission system with a double-circuit transmission line.

Various analyses in power transmission lines (e.g. line protection) depend on an equivalent model of a power transmission system. Consider a power transmission system shown in FIG. 1. This power transmission system has a double-circuit transmission line, i.e. circuit-1 and circuit-2 as shown, connecting terminals (or buses) M and N. Further, as shown, the transmission line can be connected to the rest of the network (e.g. through other transmission lines). Also, depending on the operational requirement, there can be shunt elements such as a reactor or capacitor connected at the buses as shown in FIG. 1. The load element may represent the downstream lower voltage level network and/or a direct High Tension (HT) load tapping.

Figure 2:
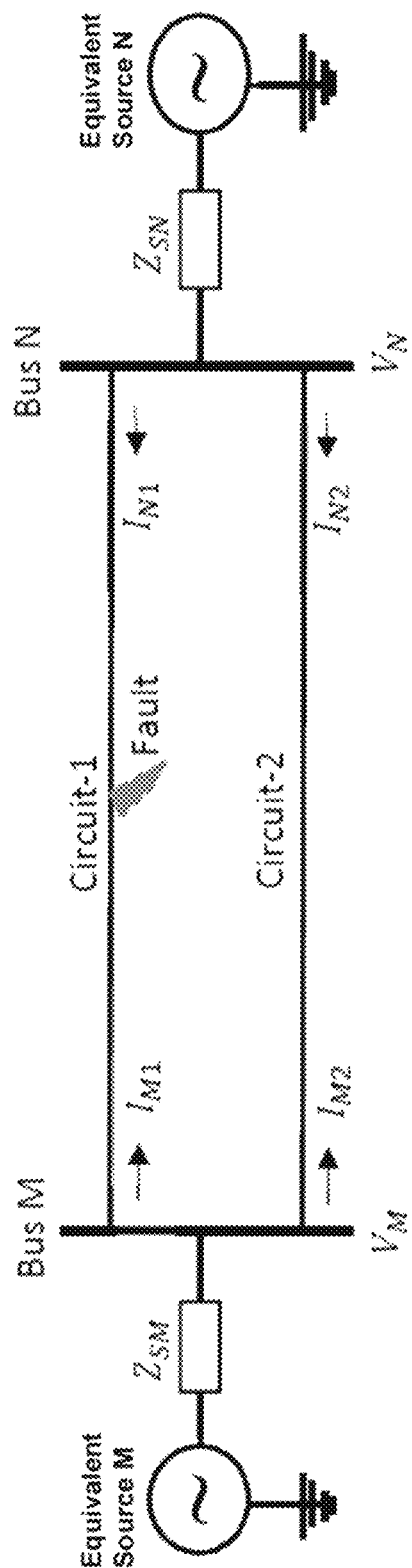
FIG. 2 shows an equivalent model of the power transmission system of FIG. 1.

An equivalent model of the power transmission system of FIG. 1 is shown in FIG. 2, in which the components of the system except the line of concern are all collapsed into two equivalent sources behind corresponding impedances. In FIG. 2, the equivalent sources are shown as Equivalent Source M, and Equivalent Source N. In this embodiment, the equivalent source is a combination of network lines (of FIG. 1). However, the equivalent source can be a combination of other power system equipment or sub-systems. For example, the equivalent source can represent grouping of one or more of a transmission line, power generator, transformer, reactor, and/or load, or other such combinations as would be apparent to those of ordinary skill in the art.

Typically, an equivalent model similar to the one shown in FIG. 2 is used in various power system devices, for example for setting the operational characteristics of distance relays, for setting the power swing blinders and out of step logic, amongst other system/device configurations etc.

Source impedances (e.g. impedance of equivalent source M or N), which are the components of a typical equivalent model, are used to define the Source Impedance Ratio (SIR) of the line. This can for instance identify whether it is a short, medium or long line for setting under/overreaching elements and designing pilot protection schemes.

This invention deals with estimation of impedances $Z_{SM}$ and $Z_{SN}$ (see FIG. 2), which are known as the source impedances (i.e. impedances of the equivalent sources). The straightforward approach to solve this problem is to use the system $Z_{BUS}$ to derive the impedances. However, as a substation level exercise, information of the entire network topology may not always be available. Therefore, in this invention our approach is to find an estimate of the impedances only with the substation level measurements and transmission line data. They are the bus voltage and line current measurements at both ends, currents on the lines incident on the terminal buses, currents through the connected shunt elements and model parameters of the line itself.

It should be noted that the method and device are described in relation to an equivalent model as shown in FIG. 2. However, it may be possible to extend the invention to other transmission line configurations. For The invention utilizes measurements during events such as, but not limited to, line faults, bus faults, short circuits on the line or switching events on the terminal buses for the estimation process. The invention utilizes digital substation measurements at both ends of a transmission line following an event to estimate the source impedances. The measured changes in bus voltages due to the extra current injection (or fault currents) are used to calculate the source impedances of the equivalent sources.

Figure 3:
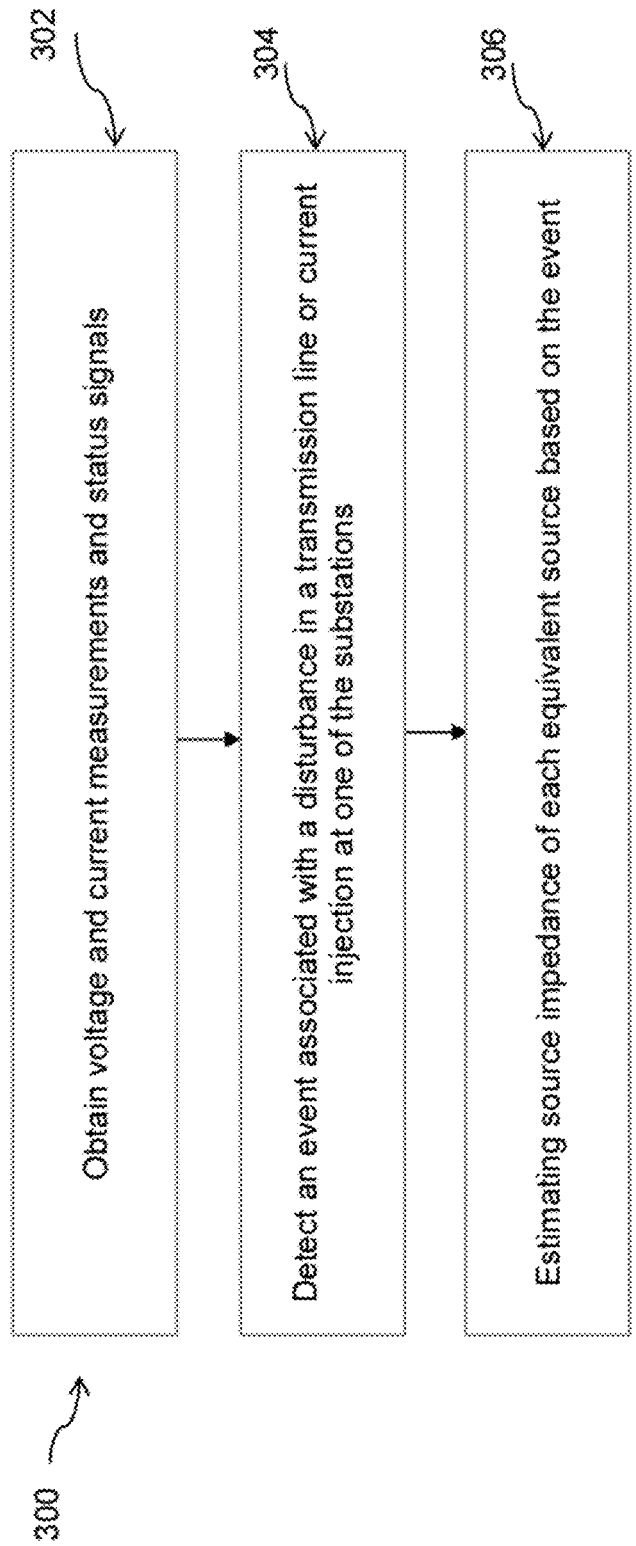
FIG. 3 is a flowchart of a method for estimating source impedances, in accordance with various embodiments of the invention.

Referring to FIG. 3, which is a flowchart of a method for estimating source impedances across one or more transmission lines (e.g. for equivalent sources in a power transmission system such as shown in FIG. 1), in accordance with various embodiments of the invention.

At 302, the method comprises obtaining voltage and current measurements and status signals. The voltages and currents can be obtained with measurement equipment such as voltage or current transformers, Rogowski coils, or other suitable voltage or current sensors.

The voltage and current measurements provide terminal (e.g. substation terminal or busbar (bus)) voltages and line currents at each substation. In other words, voltage and current measurements at each terminal of the one or more transmission lines are obtained through the corresponding measurement equipment. The line currents include currents incident on, or currents circulated from a terminal. The line currents can also include currents from the shunt elements (if provided at the terminal). The status signals are associated with switching events at the one or more transmission lines or at the substations. These events can include, but need not be limited to, switching (on/off) of a line breaker(s), a breaker at a terminal, a shunt element(s) and so forth, where such switches can be provided on transmission lines or at the substations (e.g. connected at terminals). The status signals (or switching status) can be obtained directly from the switching devices, or via other devices such as an Intelligent Electronic Devices (IEDs) or relays provided for monitoring and/controlling the corresponding switching devices.

At 304, the method comprises detecting an event associated with a disturbance in one of the one or more transmission lines or associated with current injection at one of the substations (e.g. at a substation terminal or bus). In accordance with various embodiments, the event is detected from one or more of the obtained measurements and the obtained status signals.

A fault on the line may be detected based on a status output of a protection IED on the line. For example, if a trip output is "1", then it can be concluded that a fault has occurred on the line, where the fault may have been detected from the obtained measurements. A fault event may also be detected based on status of a line breaker, including bus faults. If the fault is cleared by opening of the line, then the breaker status changes. A flag set by an operator (e.g. substation operator) indicating occurrence of a fault can also be used for detecting a fault.

Similarly, detection of a switching event of a shunt element can be done based on device status or human flags. For example, if a shunt element is added/removed at the line terminals, then the corresponding breaker status changes. Taking another example, a flag set by an operator can indicate switching (on/off) of a shunt element.

At 306, the method comprises estimating the source impedance of each equivalent source based on the event. In accordance with different embodiments, the estimated source impedance has a complex value, i.e. has both magnitude and angle. Here, the source impedance is estimated using line parameters and the voltage and current measurements associated with the event, where the measurements associated with the event comprise the measurements before and after the event. The line parameters of a transmission line can comprise one or more of, but not limited to, characteristic impedance, propagation constant and line length of the transmission.

The following describes embodiments of the method wherein an embodiment, the event is a line fault, and in another embodiment, the event is shunt injection at a substation terminal.

Figure 4:
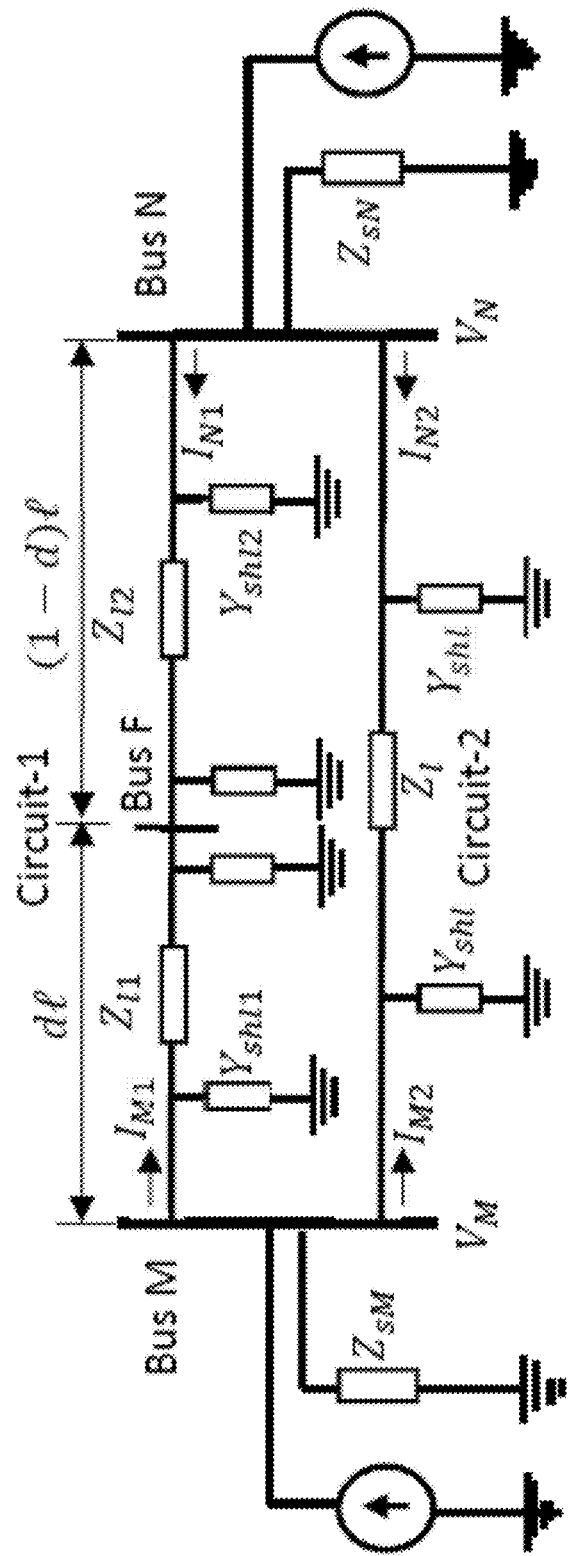
FIG. 4 shows an equivalent two-port model with transmission lines represented by a pi model, in accordance with an embodiment of the invention.

Let us consider the network shown in FIG. 4, which depicts an equivalent two-port model with the transmission lines represented by a pi-model. Node 'F' (Bus F) is a fictitious node which represents the point of occurrence of fault on the line. Note that a double-circuit line is used for the ensuing analysis and discussion as it is very common in High Voltage (HV) transmission. However, the analysis is applicable for a single circuit line also as will be indicated later.

Embodiment: Estimating Source Impedances Using Measurements Related with Line Faults Let us consider the network of FIG. 4. A fault at Bus F can be considered as injection of fault current $I_{flt}$ at the same bus. Due to this extra current injection in the network, the voltages at terminal buses M and N undergo changes. Here, terminals M and N can be seen as substation terminals or busbars (i.e. buses). Let us define the following impedances for each bus as shown in (1) below.

$$Z_{MF} := \frac{V_M^0 - V_M^f}{I_{flt}}, Z_{NF} := \frac{V_N^0 - V_N^f}{I_{flt}} \quad (1)$$

The source impedance of each bus (or bus impedance) is a ratio of the change in the corresponding bus voltage and the fault current. Symbols V and I represent voltage and current phasors respectively, which can be obtained for example by applying a Discrete Fourier Transform (DFT) on the measurements obtained from the measurement equipment (e.g. current and voltage transformers) at the substation. A '0' in superscript denotes steady state and 'f' denotes faulted state quantity. Changes in the bus voltages due to the fault current injection can also be expressed in terms of the network parameters as shown in (2) below.

$$V_M^0 - V_M^f = I_{flt} Z_{sM} \times \frac{\frac{Z_{l2}}{\left(\frac{Z_{sum}}{Z_l}\right)} + Z_{sN}}{Z_{par} + (Z_{sM} + Z_{sN})}$$

$$V_N^0 - V_N^f = I_{flt} Z_{sN} \times \frac{\frac{Z_{l1}}{\left(\frac{Z_{sum}}{Z_l}\right)} + Z_{sM}}{Z_{par} + (Z_{sM} + Z_{sN})} \quad (2)$$

From (2), $Z_{MF}$ and $Z_{NF}$ can be calculated as shown in (3) below.

$$Z_{MF} = Z_{sM} \times \frac{\frac{Z_{l2}}{\left(\frac{Z_{sum}}{Z_l}\right)} + Z_{sN}}{Z_{par} + (Z_{sM} + Z_{sN})}$$

$$Z_{NF} = Z_{sN} \times \frac{\frac{Z_{l1}}{\left(\frac{Z_{sum}}{Z_l}\right)} + Z_s}{Z_{par} + (Z_{sM} + Z_{sN})} \quad (3)$$

In (3) $Z_{sum} = Z_l + Z_{l1} + Z_{l2}$ and $Z_{par} = \frac{Z_l(Z_{l1} + Z_{l2})}{Z_{sum}}$.

In the above relationships of (2), currents in the shunt admittance branches of the line are neglected. The equations when solved to find $Z_{sM}$ and $Z_{sN}$ (i.e. source impedances of the equivalent sources M and N respectively) yield the following result as shown in (4) below.

$$Z_{sM} = \frac{-b + \sqrt{b^2 - 4ac}}{2a}$$

$$Z_{sN} = \frac{(Z_{par} + Z_{sM})Z_{MF} - \frac{Z_{l2}}{\left(\frac{Z_{sum}}{Z_l}\right)} Z_{sM}}{Z_{sM} - Z_{MF}} \quad (4)$$

In the above relationships of (4), $$a = Z_{MF} - Z_{NF} - \frac{Z_{l2}}{(Z_{sum}/Z_l)},$$

$$b = Z_{par}Z_{MF} + \frac{Z_{l1}}{(Z_{sum}/Z_l)}(Z_{MF} - Z_{NF}) - \frac{Z_{l1}Z_{l2}}{(Z_{sum}/Z_l)^2},$$

$$\text{and } c = \frac{Z_{l1}}{(Z_{sum}/Z_l)} Z_{par} Z_{MF}.$$

Assuming an equivalent pi circuit model of the transmission line, $$Z_l = Z_c \sinh(\gamma l), Z_{l1} = Z_c \sinh(\gamma dl), Z_{l2} = Z_c \sinh(\gamma(1-d)l),$$

where $Z_c$ is the characteristic impedance and $\gamma$ is the propagation constant of the line. As evident, $Z_{l1}$ and $Z_{l2}$ (i.e. impedances of the line sections between the terminals and the fault location) and all related quantities are dependent on the fault location 'd', which is a pre-requisite for this embodiment of the method. As an example, this can be found by using the simple principle that the fault point voltage calculated using measurements from either end of the line should be the same. The following can be used for calculating 'd'.

$$d = \frac{1}{\gamma l} \tanh^{-1}\left(\frac{K_1}{K_2}\right) \quad (5)$$

In (5), $K_1 = V_N^f \cosh(\gamma l) + (I_{N1}^f Z_c) \sinh(\gamma l) - V_M^f$, $$K_2 = V_N^f \sinh(\gamma l) - (I_{N1}^f Z_c) \cosh(\gamma l) - Z_c I_{M1}^f.$$

Quantities $Z_{MF}$ and $Z_{NF}$ (i.e. bus impedances) as defined in (1) are calculated by using the steady state and post fault voltage phasors from both end buses and the fault current phasor. Fault current $I_{flt}$ (considered positive away from the bus 'F') can be calculated once the fault location is obtained.

To do this, we can first obtain the fault current contribution from each terminal bus M and N as shown below in (6 (6a, 6b)).

$$I_{flt}^{M} = -\frac{1}{Z_c}\sinh(\gamma dl)V_M^f + \cosh(\gamma dl)I_{M1}^f \quad (6a)$$

$$I_{flt}^{N} = -\frac{1}{Z_c}\sinh(\gamma(1-d)l)V_N^f + \cosh(\gamma(1-d)l)I_{N1}^f \quad (6b)$$

Then the total fault current is obtained by adding up the contributions from bus M side and bus N side as shown in (7).

$$I_{flt} = I_{flt}^{M} + I_{flt}^{N} \quad (7)$$

It should be noted that the fault location and the fault current phasor can be calculated using other methods, and the method is not limited to the calculations shown above.

Figure 5:
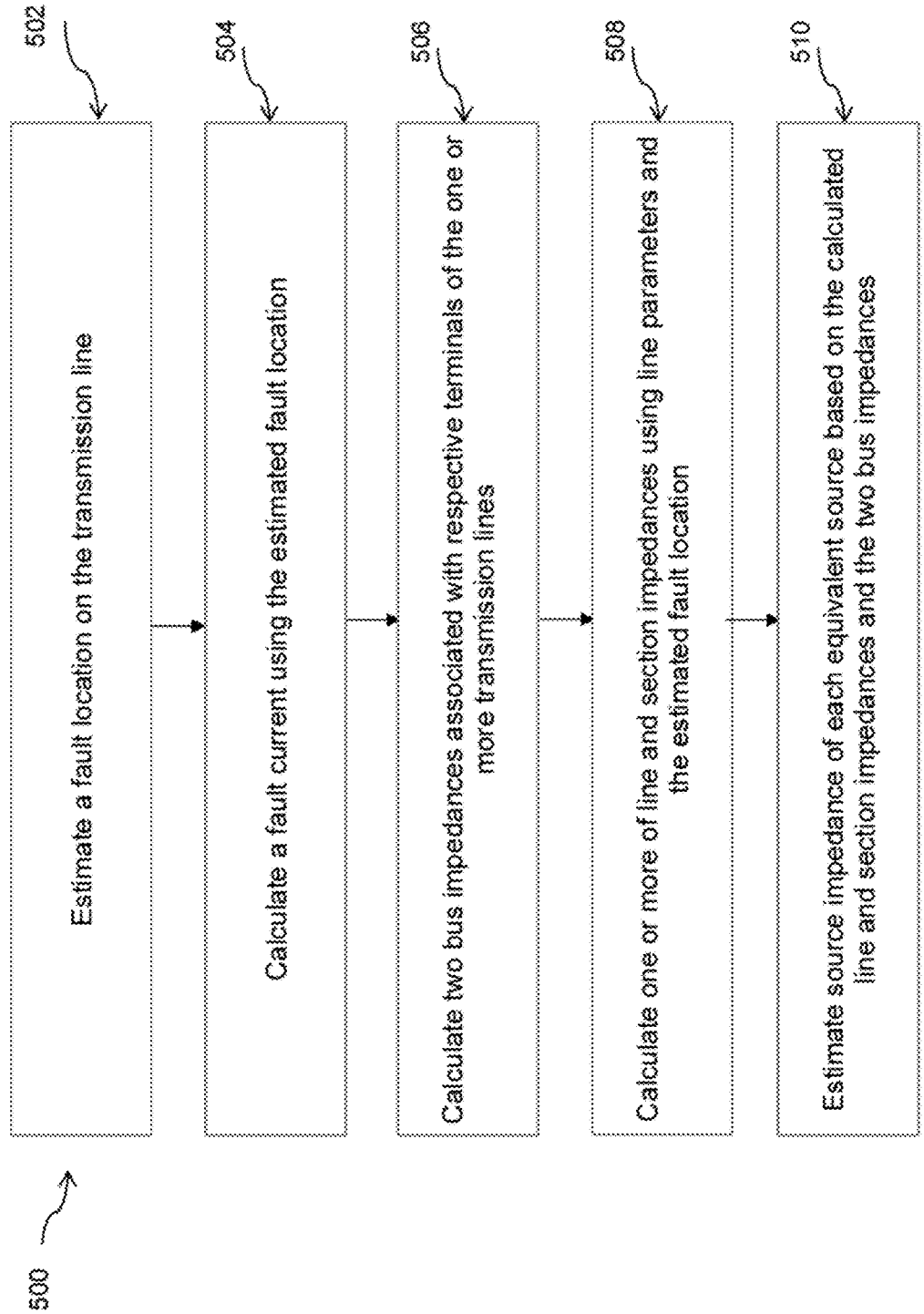
FIG. 5 is a flowchart of the method for estimating source impedances, in accordance with an embodiment of the invention.

The steps of the above embodiment of the method are illustrated in the flowchart of FIG. 5. As mentioned, the embodiment can be performed after a fault is detected on the line.

At 502, the fault location 'd' is estimated by using two ended voltage and current measurements and line parameters as in (5).

At 504, the fault current $I_{flt}$ is calculated by using the fault location d and the two ended voltage and current measurements as in (7).

At 506, the bus impedances $Z_{MF}$ and $Z_{NF}$ are calculated as ratio of the change in respective bus voltage and the fault current as in (1).

At 508, the line and/or section impedances (impedances $Z_l$, $Z_{l1}$, $Z_{l2}$) are calculated using the line parameters and the fault location d.

At 510, the source impedances of the equivalent sources ($Z_{sM}$ and $Z_{sN}$) are estimated using (4), i.e. using the bus impedances and the line and/or section impedances.

In equations (1) and (2), the currents in the shunt admittance branches were ignored. In order to take them into account, the following corrections can be done if shunt admittance branches are present in the system.

Correction 1 (C1):

To $Z_{MF}$ and $Z_{NF}$ as obtained in step 506 above, multiply $$\xi = \frac{1}{1 - Z_{FF}Y_{shd}}$$

as a correction factor where, $$Z_{FF} = \frac{V_F^0 - V_F^f}{I_{flt}}, \text{ and}$$

$$Y_{shd} = Y_{shl1} + Y_{shl2} = \frac{1}{Z_c}\tanh\left(\frac{\gamma dl}{2}\right) + \frac{1}{Z_c}\tanh\left(\frac{\gamma(d-1)l}{2}\right).$$

Note that once the fault location d is known, the fault point voltage $V_F$ can be found by using $V_M$ and $I_{M1}$ measurements in the pi-equivalent model equations for the line section MF of the faulted circuit.

Correction 2 (C2):

From the obtained values of $Z_{sM}$ and $Z_{sN}$ as in step 5 above, remove the contribution from the line shunt admittances as:

$$Z_{sM}^{corr} = \frac{1}{\left(\frac{1}{Z_{sM}} - Y_{shl} - Y_{shl1}\right)}, Z_{sN}^{corr} = \frac{1}{\left(\frac{1}{Z_{sN}} - Y_{shl} - Y_{shl2}\right)},$$

In the above, $$Y_{shl} = \frac{1}{Z_c}\tanh\left(\frac{\gamma l}{2}\right), Y_{shl1} = \frac{1}{Z_c}\tanh\left(\frac{\gamma dl}{2}\right) \text{ and } Y_{shl2} = \frac{1}{Z_c}\tanh\left(\frac{\gamma(1-d)l}{2}\right).$$

Figure 6:
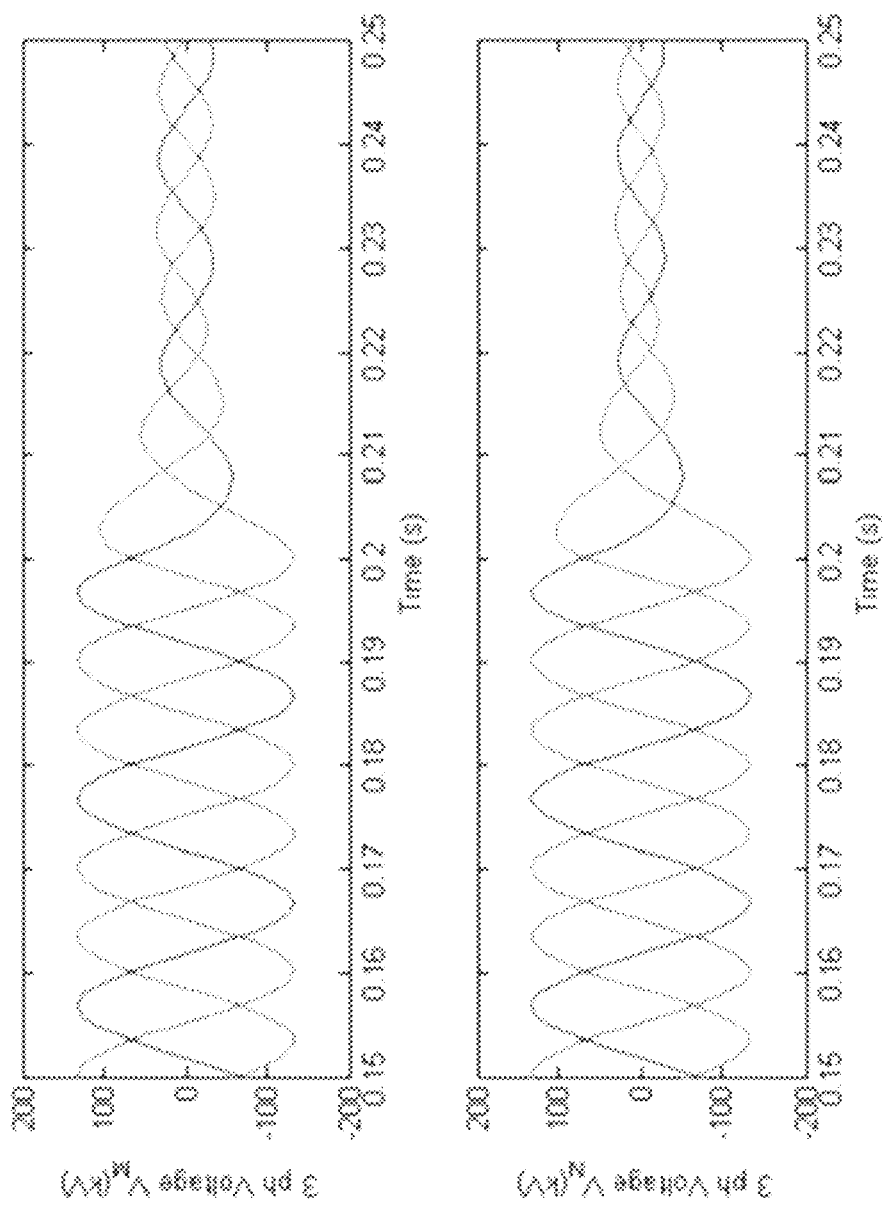
FIGS. 6 and 7 are example graphical results of bus voltages and line currents following a fault simulated at a mid-point of a line.
Figure 7:
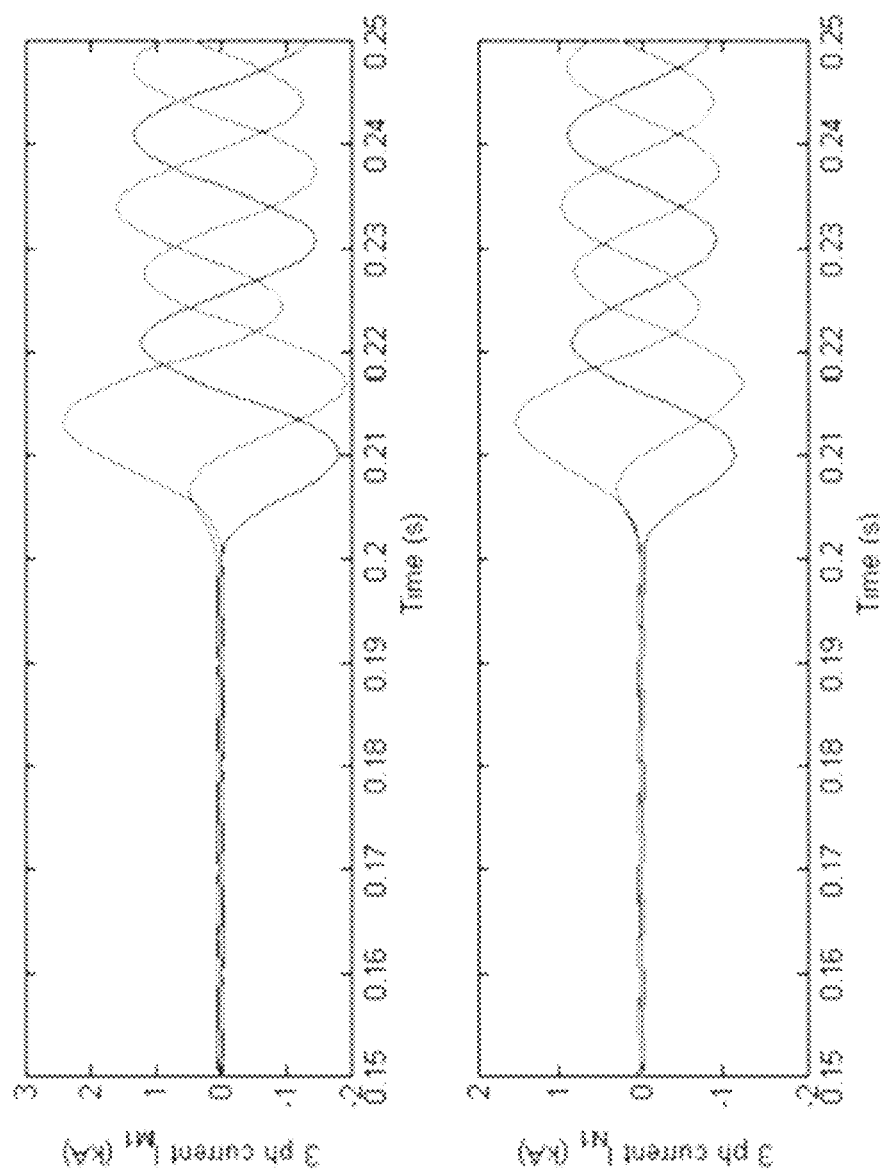

A test system of the type shown in FIG. 2 is considered for the numerical illustrations. It is simulated in PSCAD environment. The lines (120 km each) are represented with frequency dependent phase models in the simulation. The characteristic impedance of the line $Z_c$ is 244.16∠−3.4745Ω and the propagation constant γ is 1.0806×10⁻⁰⁶∠86.461°. The line impedance in each circuit is approximately equal to 31.661∠82.922°. The equivalent sources are modelled each as 50 Hz, 220 kV voltage source behind an impedance, with a phase angle difference of 5.5°. The values of source impedances, i.e., $Z_{sM}$ and $Z_{sN}$ are kept as 63.32∠84.81° and 158.3∠79° for the purpose of this illustration. A fault is created at the mid-point of Circuit 1 of the transmission line at 0.2 s. Following the fault, the bus voltages and line currents undergo changes as shown in FIGS. 6 and 7.

For the calculations, we have used only the voltage and current measurements in the window spanning 30 ms to 50 ms (milliseconds) from the time of fault inception. This is done assuming the fault is cleared by operating the circuit breaker at least after two and a half cycles from the fault inception time; after which we will not be having any post fault line current measurements of the faulted circuit. The result of each step of the analysis are presented below.

1. Fault location estimated using (5): d=0.5002
2. Fault current calculated using obtained value of d in (6) and (7): $I_{flt}$=2.2835∠14.936° kA
3. $Z_{MF}$ calculated as $$\frac{V_M^0 - V_M^f}{I_{flt}}$$

and correction factor C1 applied is found to be=46.071∠82.594°Ω, similarly, $Z_{NF}$=49.373∠82.193°Ω

4. Using known values of $Z_c$, γ and d, we obtain $Z_l$=31.573∠82.941°Ω, $Z_{l1}$=15.823∠82.926°Ω, $Z_{l2}$=15.817∠82.926°Ω

5. Using calculated values of $Z_{MF}$, $Z_{NF}$, $Z_l$, $Z_{l1}$, $Z_{l2}$ in (4) and then applying correction C2 we obtain $Z_{sM}^{corr}$=63.341∠84.6Ω and $Z_{sN}^{corr}$=158.5∠78.436Ω, which amounts to (total vector) errors of 0.4% and 1% respectively.

Figure 8:
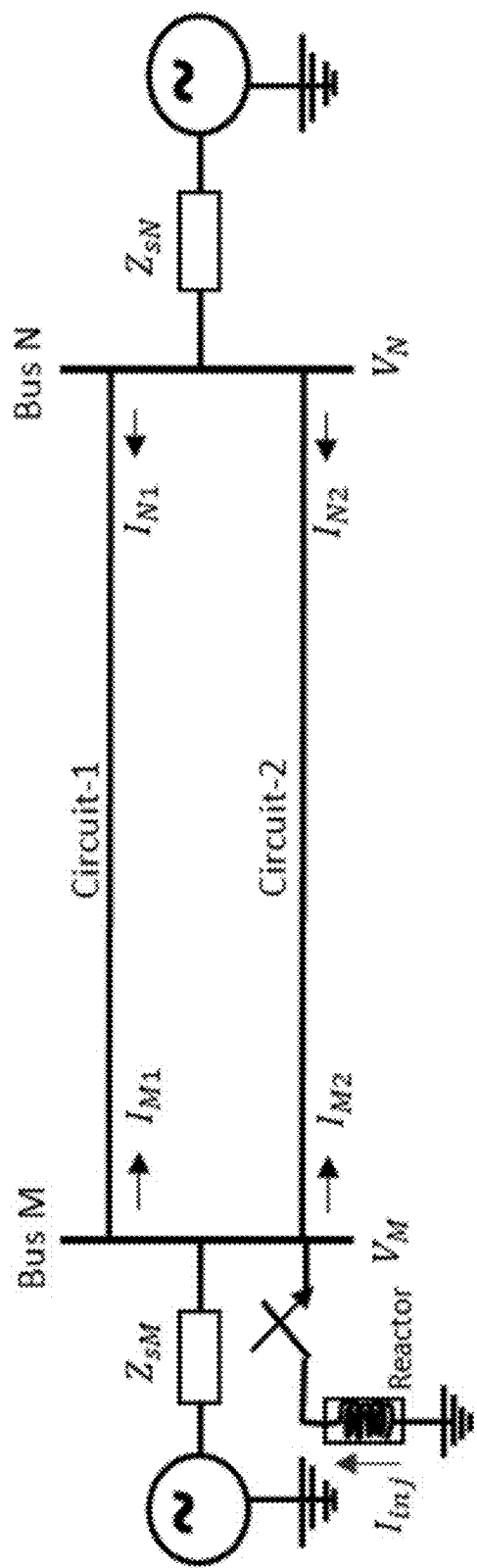
FIG. 8 shows an equivalent two-port model with transmission lines represented by a pi model, in accordance with another embodiment of the invention.

Embodiment: Estimating Source Impedances Using Measurements Related with Shunt Injections For this embodiment, the equivalent two-port model with transmission lines represented by pi model as shown in FIG. 8 is considered. Let us consider current injection due to a shunt element (e.g. reactor/capacitor/load) switching event on a terminal bus, say bus M. As done for the above embodiment, let us define the following impedances for each bus M and N (i.e. bus impedances).

$$Z_{MF} := \frac{V_M^0 - V_M^f}{I_{inj}}, Z_{NF} := \frac{V_N^0 - V_N^f}{I_{inj}} \quad (8)$$

Here, $I_{inj}$ represents the shunt current injection at the bus (considered positive when measured in the direction into the bus). Changes in the bus voltages due to the current injection can also be expressed in terms of the network parameters as follows:

$$V_M^0 - V_M^f = I_{inj} Z_{sM} \times \frac{(Z_l/2) + Z_{sN}}{(Z_l/2) + (Z_{sM} + Z_{sN})}, \quad (9)$$

$$V_N^0 - V_N^f = I_{inj} Z_{sN} \times \frac{Z_{sM}}{(Z_l/2) + (Z_{sM} + Z_{sN})}$$

From (9), $Z_{MF}$ and $Z_{NF}$ can be calculated as shown in (10) below.

$$Z_{MF} = Z_{sM} \times \frac{(Z_l/2) + Z_{sN}}{(Z_l/2) + (Z_{sM} + Z_{sN})} \quad (10)$$

$$Z_{NF} = Z_{sN} \times \frac{Z_{sM}}{(Z_l/2) + (Z_{sM} + Z_{sN})}$$

The equation (10) when solved to find $Z_{sM}$ and $Z_{sN}$ (i.e. source impedances of the equivalent sources) yields the result as shown in (11), which can be further simplified to the expressions shown in (12).

$$Z_{sM} = \frac{\left(\frac{Z_l}{2}\right) Z_{MF}}{\frac{Z_l}{2} + Z_{NF} - Z_{MF}}, Z_{sN} = \frac{\left(Z_{sM} + \frac{Z_l}{2}\right) Z_{NF}}{Z_{sM} - Z_{NF}} \quad (11)$$

$$Z_{sM} = \frac{Z_{MF}}{1 + \frac{I_M^O - I_M^f}{I_{inj}}}, Z_{sN} = \frac{Z_{NF}}{\frac{I_N^O - I_N^f}{I_{inj}}} \quad (12)$$

In (12), $I_M = I_{M1} + I_{M2}$, $I_N = I_{N1} + I_{N2}$, '0' in superscript denotes steady state quantity and 'f' denotes value of the entity post the switching event. Note that the expression in (9) can be found by keeping d=0 in equation (2). For shunt injection at bus N, equations similar to (9)-(12) can be derived by keeping d=1 in equations (2).

Figure 9:
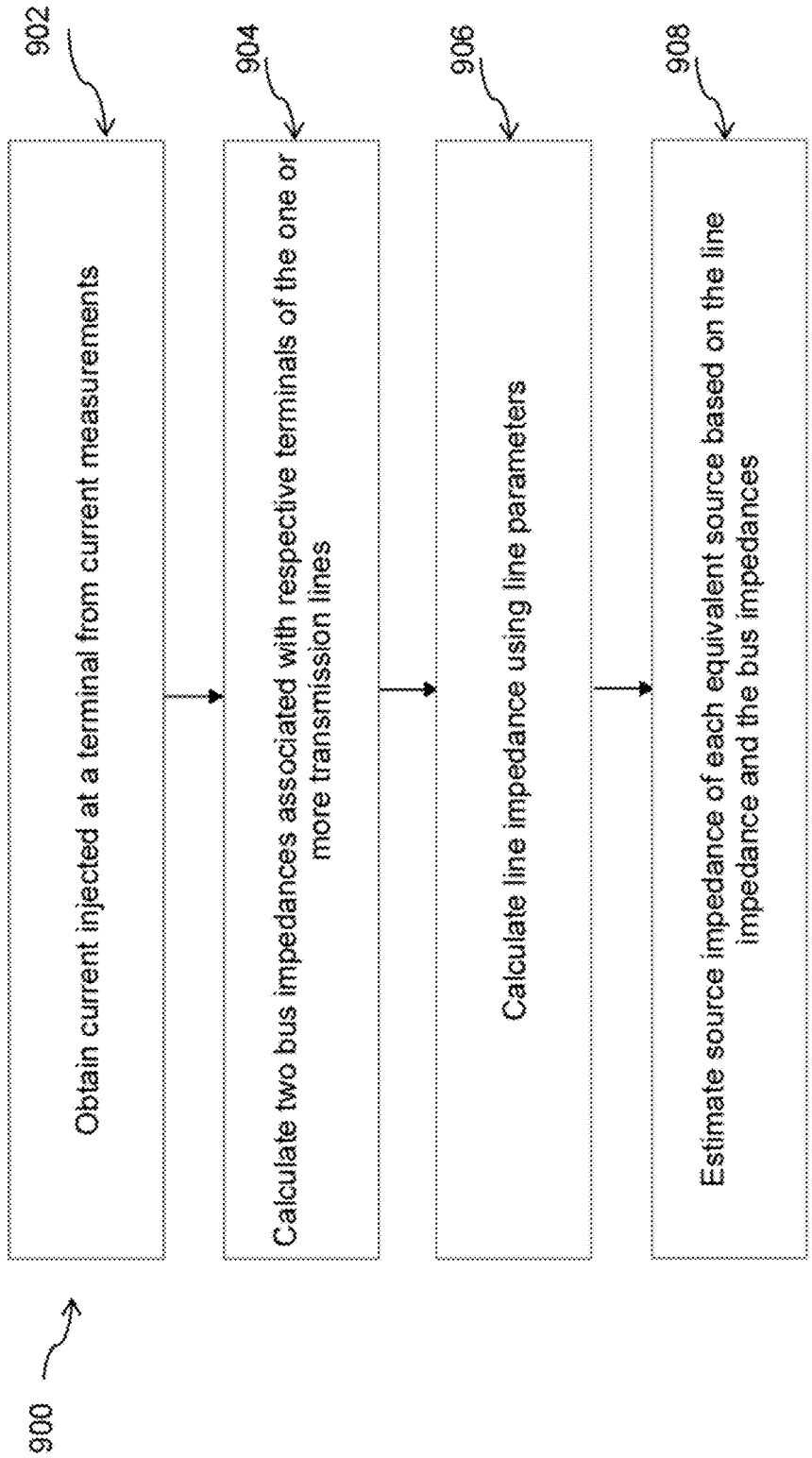
FIG. 9 is a flowchart of the method for estimating source impedances, in accordance with another embodiment of the invention.

The steps of the above embodiment of the method are illustrated in the flowchart of FIG. 9. As mentioned, the embodiment can be performed after a switching event is detected at a terminal bus.

At 902, the injected current $I_{inj}$ is obtained directly from the substation measurements.

At 904, the bus impedances ($Z_{MF}$ and $Z_{NF}$) are calculated as ratio of the change in respective bus voltage and the injected current as in equation (8).

At 906, the line impedance $Z_l$ is calculated using the line parameters.

At 908, the source impedances ($Z_{sM}$ and $Z_{sN}$) of the equivalent sources are estimated using the obtained $Z_{MF}$ and $Z_{NF}$ in (11). Alternately, the source impedances ($Z_{sM}$ and $Z_{sN}$) are estimated by using $Z_{MF}$, $Z_{NF}$ and measured change in line currents at both the ends as in (12).

The effect of the line shunt admittances may optionally be considered in the above embodiment. For considering their effect, the following correction needs to be applied.

Correction:
From the obtained values of $Z_{sM}$ and $Z_{sN}$ as in step 908 above, remove the contribution from the line shunt admittances as $$Z_{sM}^{corr} = \frac{1}{\left(\frac{1}{Z_{sM}} - 2Y_{shl}\right)}, Z_{sN}^{corr} = \frac{1}{\left(\frac{1}{Z_{sN}} - 2Y_{shl}\right)}, \text{where } Y_{shl} = \frac{1}{Z_c} \tanh\left(\frac{\gamma l}{2}\right).$$

Figure 10:
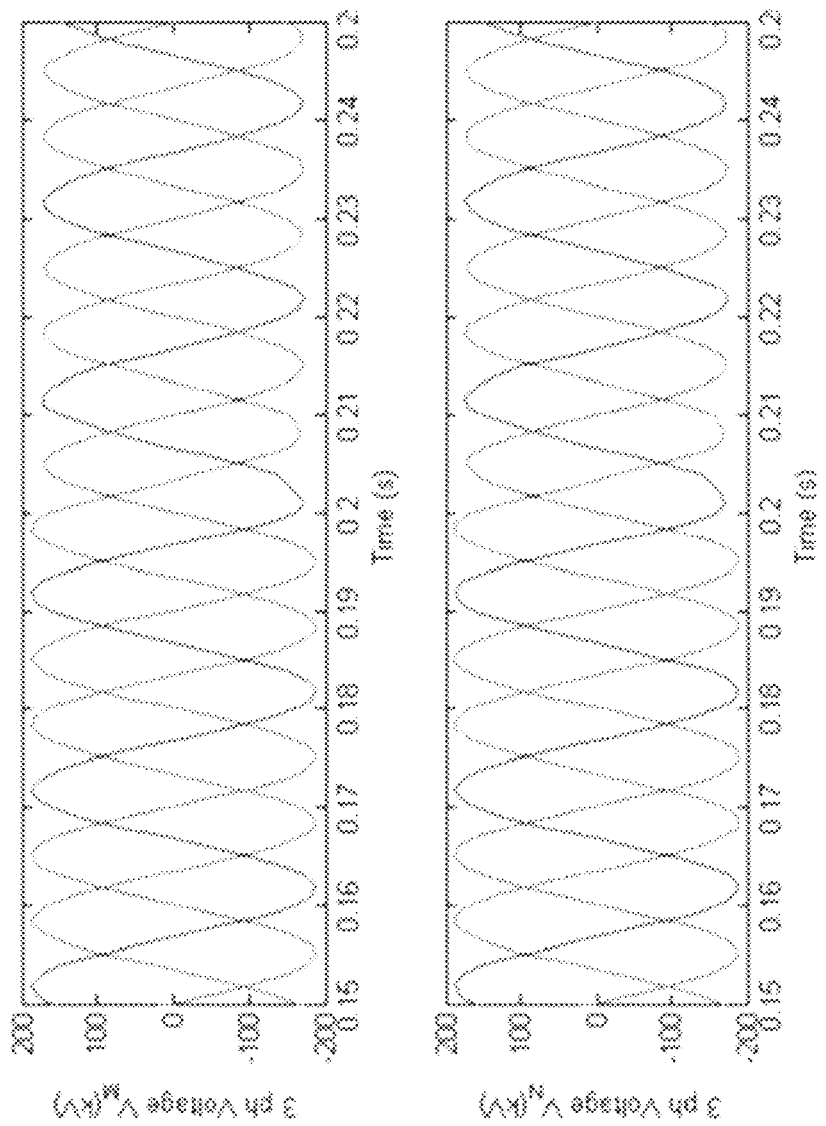
FIGS. 10 and 11 are example graphical results of bus voltages and line currents following a simulated shunt switching event.
Figure 11:
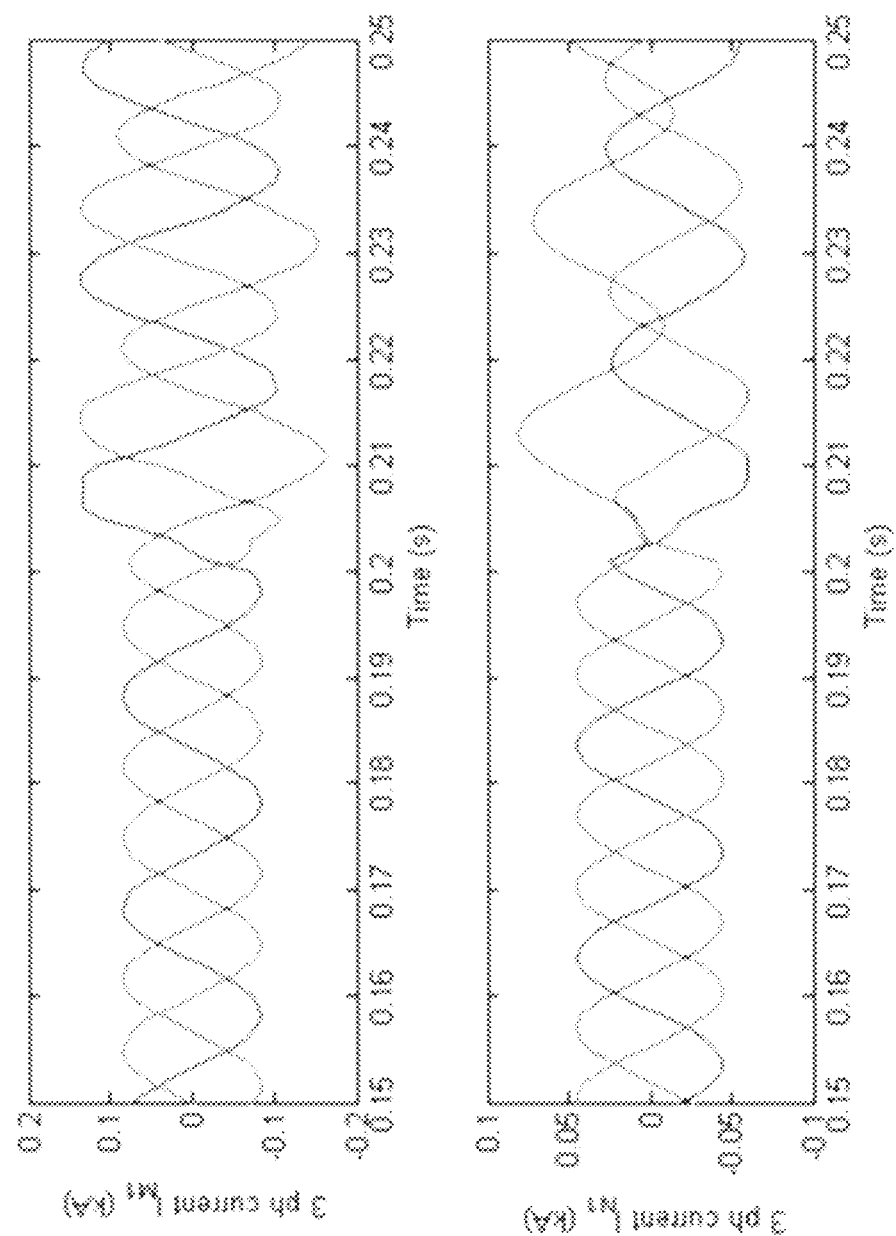

A test system similar to that for the embodiment of line faults is considered for the numerical illustrations of the above embodiment related to shunt injections. We create a shunt reactor switching on Bus M at 0.2 s and use the obtained measurements to estimate the source impedances. The reactor which is switched onto the bus is rated at 100 MVar at 220 kV nominal line-to-line bus voltage. Following the switching, bus voltages and line currents undergo change as shown in FIGS. 10 and 11. The result of each step of the analysis is presented below.

1. The injected current due to the reactor switching is measured as $I_{inj}$=0.35434∠−91.192° kA
2. $Z_{MF}$ calculated as $$\frac{V_M^O - V_M^I}{-I_{inj}} = 48.699 \angle 83.005° \, \Omega,$$

similarly, $$Z_{NF} = \frac{V_N^O - V_N^I}{-I_{inj}} = 44.653 \angle 82.735° \, \Omega$$

3. Measured change in line currents $I_M^o - I_M^f$ and $I_N^o - I_N^f$ are obtained as 0.082745∠94.675° and 0.099926∠−87.6° kA respectively. Using them with the values of $I_{inj}$, $Z_{MF}$ and $Z_{NF}$ in (12) and then applying correction C3 we obtain $Z_{sM}^{corr}$=61.344∠84.956°Ω and $Z_{sN}^{corr}$=146.23∠79.983°Ω, amounting to (total vector) error of 1.82% and 1.75% respectively.

In case of bus faults, a similar approach can be employed, and in place of the current injected due to the switching event, the fault current at the bus can be obtained from the obtained measurements.

The method described above is not restricted to double-circuit lines and can easily be extended to single circuit lines. For a single circuit transmission line, the following adjustments need to be made.

(a) Line faults: Since there is only one circuit, we can consider impedance of the second circuit as $Z_j = \infty$. This makes the terms $$\frac{Z_{sum}}{Z_l} = 1$$

and $Z_{par} = Z_{l1} + Z_{l2}$. Substitute these values in equation (4) to obtain $Z_{sM}$ and $Z_{sN}$.

(b) Bus injection: Use equation (12) to obtain the source impedances with the only change that $I_M = I_{M1}$ and $I_N = I_{N1}$ as the second circuit is not present.

The method can be implemented in a computer program product. Accordingly, in an embodiment, the invention provides a computer program product for estimating source impedances across one or more transmission lines. The computer program product can be, but need not be limited to, an optical disc (e.g. a DVD, CD, or other disc type computer storage product), or a hard-drive or other memory device capable of storing computer program or machine-readable instructions. As an example, the computer program product can be a memory with instructions, that can be part of a server or a substation device.

The computer program product comprises a non-transitory computer readable storage medium. Examples of such non-transitory computer readable storage medium can be, but need not be limited to, a random access memory (RAM), a read only memory (ROM), an erasable programmable read only memory (EPROM), an external memory device (e.g. USB memory, flash drive etc.) or other similar types of storage medium. The non-transitory computer readable storage medium comprises instructions that, when executed by a processor, cause the processor to execute the method (i.e. part of or the entire method as per the case) as described above. These instructions are program or machine-readable instructions defining the method (i.e. instructions defining the method as described above). These instructions can be executed with a processor which can be one of or a combination of a computer processing unit, a multiprocessor, a microcontroller, and a digital signal processor. When such instructions are executed, one or more steps of the method are performed.

Figure 12:
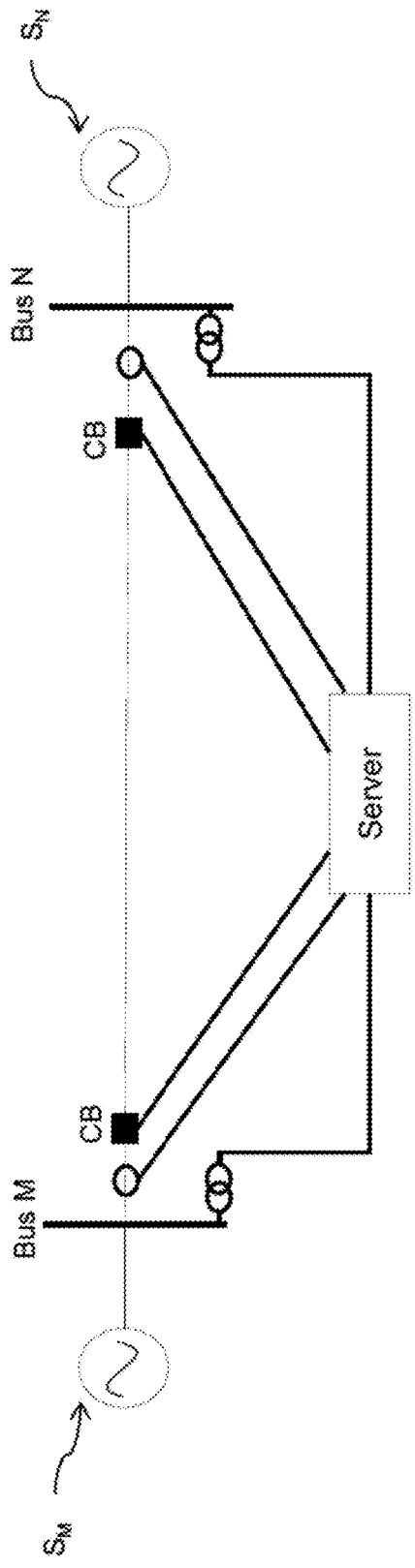
FIG. 12 is a simplified representation of a power transmission system where a server is provided for estimating source impedances, in accordance with an embodiment of the invention.
Figure 13:
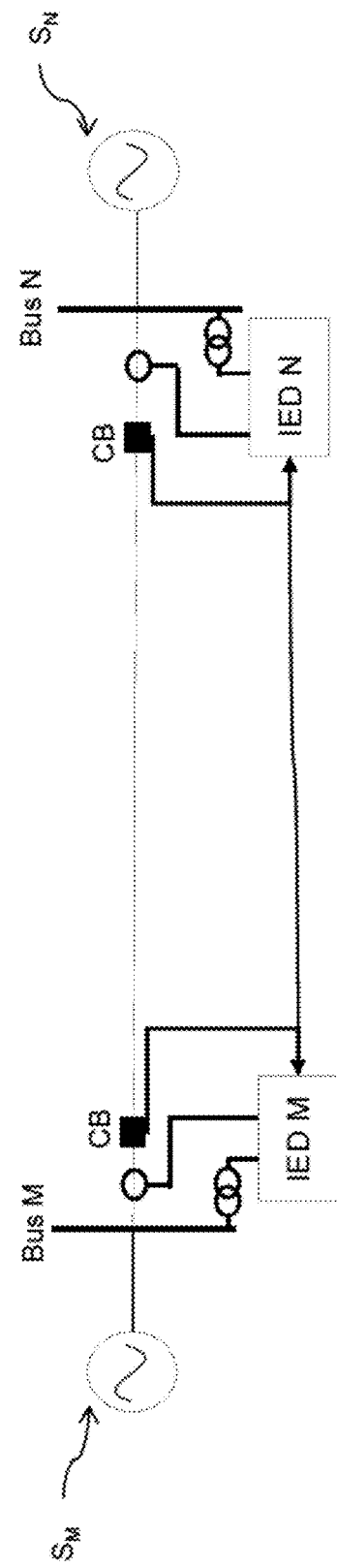
FIG. 13 is a simplified representation of a power transmission system where an Intelligent Electronic Device is provided for estimating source impedances, in accordance with an embodiment of the invention.

The method described above can be implemented with a power system or substation device. For example, as shown in FIG. 12, the method can be implemented with a server. This server may be a substation server, or a remotely located server, which receives the obtained voltage and current measurements (e.g. from the measurement equipment, IEDs or relays) and the status signals (e.g. from the switching devices or relays). Taking another example, as shown in FIG. 13, the method can be implemented with an Intelligent Electronic Device (IED), which has local end (terminal) voltage and current measurements and is communicatively coupled with an IED at the remote end to receive measurements/data corresponding to the other end. In this example, the IED also has the status signals.

Figure 14:
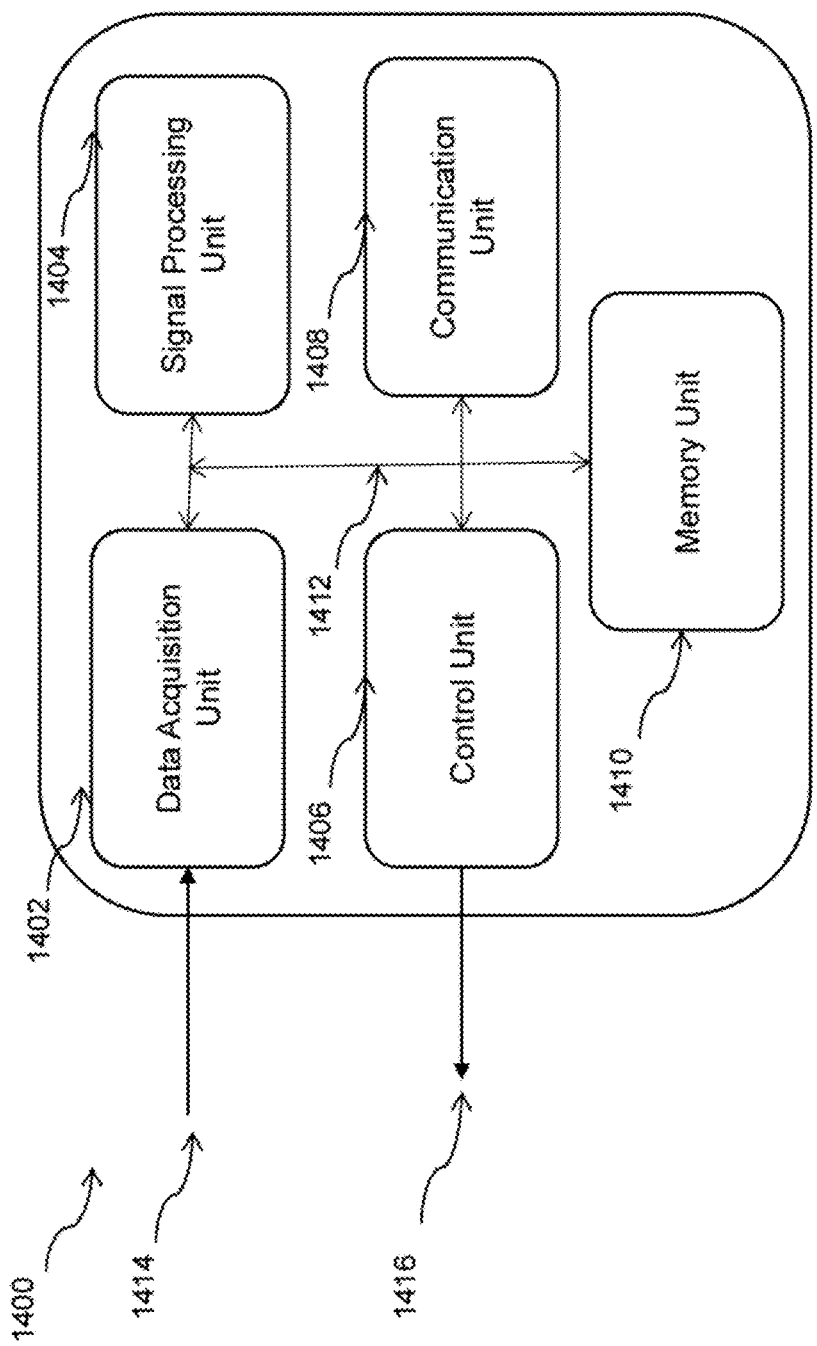
FIG. 14 is a block diagram of a device for estimating source impedances, in accordance with an embodiment of the invention.

FIG. 14 is a block diagram of such a device (e.g. server or IED) for estimating the source impedances in the power transmission system. As shown, the device comprises a data acquisition unit (1402), a signal processing unit (1404), a control unit (1406), a communication unit (1408) and a memory unit (1410) communicatively coupled with each other (e.g. via a communications bus (1412)).

The various modules of the device are implemented with hardware devices such as a processor, I/O's etc. The processor is configured to invoke each module (individually or simultaneously) by executing respective instructions to perform one or more of the various steps of the method described herein above. Such instructions may be stored in the memory unit. Each module is configured to perform one or more steps of the method. For example, the data acquisition unit can perform step 302, while the signal processing unit can perform steps 304 and 306.

In accordance with various embodiments, the data acquisition unit is configured to obtain the voltage and current measurements (e.g. as shown by 1414) and the status signals, from the measurement equipment (or IEDs or relays) and the switching devices (or associated IEDs or relays). Further, the signal processing unit is communicatively coupled to the data acquisition unit and configured to detect an event associated with a disturbance in one of the one or more transmission lines, or current injection at one of the terminals.

The signal processing unit is configured to detect the event from one or more of the obtained measurements and the obtained status signals. Alternately, the event may be detected by another module (e.g. an event detection module (not shown)), and the same can be fed as input to the data acquisition unit and/or the signal processing unit.

The signal processing unit is also configured to estimate the source impedance of each equivalent source based on the event, using line parameters and the voltage and current measurements associated with the event, the measurements associated with the event comprising the measurements before and after the event.

The device also comprises a control unit communicatively coupled to the signal processing unit. There may be a need to adapt an equivalent model due to changes in the source impedances. In such situations, the control unit is configured to adapt (e.g. shown by 1416) an equivalent model to perform at least one of a protection function and a control function based on the estimated source impedances. Such adaptations can be pushed to the relevant devices (e.g. relays, when the device is a server) via the communication unit. Alternately, the memory can be updated according to the adaptations. In some cases, as needed, the updated source impedances can be communicated to another device for use at the corresponding devices.

In an embodiment, the various modules of the device are configured to perform the steps in relation to estimating the source impedances according to the embodiment of FIG. 5. In another embodiment, the various modules of the device are configured to perform the steps in relation to estimating the source impedances according to the embodiment of FIG. 9. In these embodiments, the signal processing unit can also be configured to perform the corrections for shunt admittance branches or line shunt admittances.

Thus, the invention utilizes digital substation data during system events for simultaneous estimation of the source impedances across one or more transmission lines. Events such as shunt injections at the buses, bus faults and faults on the line can be utilized for the estimation. Further, the invention provides complex source impedances instead of only providing source impedance magnitudes. The invention utilizes only fault location information as input for the source impedance estimation and does not require information of the external network topology. In other words, it is computationally simple and non-iterative in implementation.

The invention can help in achieving the following objects. Firstly, an online estimate of the source impedances can facilitate adaptive setting of relays, which can thereby improve its dependability and security. Secondly, a method which depends only substation level measurements can be of immediate use to a substation engineer. Thirdly, a method which can utilize events such as faults on the line and switching of shunt elements at the terminal buses is of more practical importance as compared to staging bus faults, which may not always be possible or acceptable.

The invention can be used to improve the following protection functions:
  It improves the distance relay performance and enables adaptive setting features.
  It improves accuracy of single ended fault location algorithms.
  It can be used to calculate the system non-homogeneity factor and distance relay reach calculation.

Source impedance information can be used for adaptive switching the different phase selection methods (phasor or super imposed quantities or traveling wave based) to protect the systems with high renewables.

It can be useful in calculation of short circuit ratio (SCR) and it will be used for over current relay co-ordination.

Figure 15:
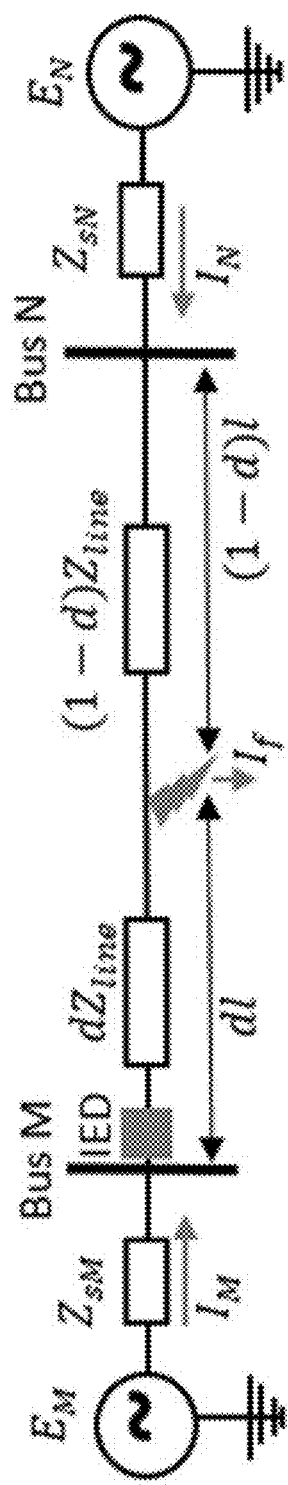
FIG. 15 is a simplified representation of a two-source equivalent source across a transmission line, in accordance with an exemplary scenario.

The above benefits can be understood for example from the description provided below. Consider the two-source equivalent model shown in FIG. 15. It can be shown by circuit analysis that:

$$V_M = I_M d Z_{line} + \left(\frac{I_{fM}}{D_M}\right) R_f \text{ where, } D_M = \frac{(1-d)Z_{line} + Z_{sN}}{Z_{sM} + Z_{line} + Z_{sN}} \quad (E1)$$

represents the current distribution factor for the fault current as seen from the Bus M side. $V_M$ and $I_M$ are the voltage and current measured at the IED during the fault and $I_{fM}$ is the fault current component in the current $I_M$ or in other words the fault current contribution from the local (with respect to the IED location) Bus M. Equation (E1) can be re-written as:

$$Z_M = \frac{V_M}{I_M} = d Z_{line} + \left(\frac{I_{fM}}{I_M}\right)\frac{R_f}{D_M} \quad (E2)$$

which expresses the impedance measured at the IED. Clearly, estimates of the source impedances can help in analyzing the relay reach for various fault related parameters such as the local/remote fault current contribution, fault location and fault resistance. Based on these analyses, resistive and reactive reach settings of the relay operating characteristics can be adapted.

The relay impedance trajectory during a power swing is approximated by the expression below:

$$Z_M(\delta) = \frac{Z_{sM} + Z_{line} + Z_{sN}}{2}\left(1 - j\cot\frac{\delta}{2}\right) - Z_{sM} \quad (E3)$$

in which, the angle δ represents the phase advance of the equivalent source $E_M$ over $E_N$. The expected swing impedance trajectory during an actual power swing can be analyzed using the model of equation (E3), by plugging in the values of the estimated source impedances and varying angle δ from initial loading angle to 180°. Using this estimated trajectory, power swing blocking parameters such as blinder positions with respect to distance zone elements and delay timer setting can be adaptively determined.

Equation (E2) also forms the basic principle for the single ended fault location algorithm in which $V_M$, $I_M$ and $I_{fM}$ are the measurable inputs and 'd' is the unknown to be estimated along with the unknown fault resistance $R_f$. Source impedance estimates are vital for such algorithms which are used to characterize the term $D_M$.

The system non-homogeneity factor represents the variation among the angles associated with the three impedances $Z_{sM}$, $Z_{line}$ and $Z_{sN}$. It is a direct result of the source impedance estimates and it can be useful in adapting certain analyses. For example, if the system is homogeneous, i.e., all the three impedances have approximately the same angle, then only the imaginary part of equation (E2) can be solved to directly obtain 'd' without the need of estimating $R_f$. This is because in such a situation, the imaginary part of the second term on the right-hand side of (E2) tends towards zero.

The estimated source impedances can be used to decide between a current based or a voltage-based phase selection strategy implemented at the IED bus M. For example, a weak source behind the IED bus (i.e., high source impedance $Z_{sM}$) will typically result in lesser incremental (or fault) current contribution from the bus M. In such cases, it is better to switch to an incremental voltage-based phase selection strategy.

Estimated source impedances can also be used to infer the short circuit MVA at each of the terminal buses M and N as expressed in equations below:

$$SC\ MVA \text{ at Bus } M(\text{in } pu) = \frac{Z_{sM} + Z_{line} + Z_{sN}}{Z_{sN}(Z_{line} + Z_{sM})}$$

$$SC\ MVA \text{ at Bus } N(\text{in } pu) = \frac{Z_{sM} + Z_{line} + Z_{sN}}{Z_{sM}(Z_{line} + Z_{sN})}$$

Such information is useful for monitoring of fault current levels and adaptive coordination of overcurrent relay characteristics.

The invention claimed is:

1. A method for estimating source impedances across one or more transmission lines connecting at least two substations, each substation associated with an equivalent source having a respective source impedance, the method comprising:
    obtaining voltage and current measurements and status signals, the voltage and current measurements providing terminal voltages and line currents at each substation, and the status signals being associated with switching events at the one or more transmission lines or at the substations;
    detecting an event associated with a disturbance in a transmission line or current injection at one of the substations, the event being detected from one or more of the obtained measurements and the obtained status signals; and
    estimating the source impedance of each equivalent source based on the event, using line parameters and the voltage and current measurements associated with the event, the measurements associated with the event comprising the measurements before and after the event.

2. The method of claim 1, wherein the line parameters comprise one or more of characteristic impedance and propagation constant of a transmission line.

3. The method of claim 2, wherein the line parameters further comprise line length of the transmission line.

4. The method of claim 1, wherein the source impedance being further estimated using a fault current or a current injected at a terminal of the substation.

5. The method of claim 1, wherein the disturbance is a fault on one of the one or more transmission lines, and wherein estimating the source impedance of each equivalent source comprises:
    estimating a fault location on the transmission line;
    calculating a fault current using the estimated fault location;
    calculating two bus impedances, each bus impedance being associated with a respective terminal of the one or more transmission lines, and calculated using a change in the terminal voltages of the corresponding terminal and the calculated fault current;
    calculating one or more of line and section impedances using the line parameters and the estimated fault location, wherein the section impedances are impedances of line sections located between the terminals and the estimated fault location; and estimating the source impedance of each equivalent source using one or more of the calculated line impedance and the calculated section impedances, and the two bus impedances.

6. The method of claim 5, wherein calculating each bus impedance comprises multiplying the bus impedance with a correction factor, wherein the correction factor is calculated using a ratio of a fault voltage and the calculated fault current, and shunt admittances of the line sections, wherein the fault voltage is calculated using the estimated fault location, and the shunt admittances are calculated using the estimated fault location and the line parameters, optionally wherein estimating the source impedance comprises removing contribution of shunt admittance, wherein the contribution of shunt admittance is calculated using one or more of the shunt admittance of the at least one transmission line, and the shunt admittances of the line sections calculated using on the fault location and the line parameters.

7. The method of claim 1, wherein the estimated source impedance is a complex source impedance having both magnitude and angle.

8. The method of claim 1, wherein the estimated source impedance is used in configuring one of a protection function and a control function in a substation device.

9. A computer program product for estimating source impedances across one or more transmission lines, the computer program product comprising a non-transitory computer readable storage medium comprising instructions that, when executed by a processor, cause the processor to execute the method of claim 1.

10. A device for estimating source impedances across one or more transmission lines connecting at least two substations, each substation associated with an equivalent source having a respective source impedance, the device comprising:

a data acquisition unit configured to obtain voltage and current measurements and status signals, the voltage and current measurements providing terminal voltages and line currents at each substation, and the status signals being associated with switching events at the one or more transmission lines or at the substations;

a signal processing unit communicatively coupled to the data acquisition unit and configured to:

detect an event associated with a disturbance in one of the one or more transmission lines or current injection at one of the substations, the signal processing unit configured to detect the event from one or more of the obtained measurements and the obtained status signals; and estimate the source impedance of the equivalent source based on the event, using line parameters and the voltage and current measurements associated with the event, the measurements associated with the event comprising the measurements before and after the event; and a control unit communicatively coupled to the signal processing unit.

11. The device of claim 10, wherein the line parameters comprise one or more of characteristic impedance and propagation constant of a transmission line.

12. The device of claim 11, wherein the line parameters further comprise line length of the transmission line.

13. The device of claim 10, wherein the source impedance being further estimated using a fault current or a current injected at a terminal of the substation.

14. The device of claim 10, wherein the disturbance is a fault on one of the one or more transmission lines, and wherein the signal processing unit is configured to:

estimate a fault location on the transmission line;

calculate a fault current using the estimated fault location;

calculate two bus impedances, each bus impedance being associated with a respective terminal of the one or more transmission lines, and calculated using a change in the terminal voltages of the corresponding terminal and the calculated fault current;

calculate one or more of line and section impedances using the line parameters and the estimated fault location, wherein the section impedances are impedances of line sections located between the terminals and the estimated fault location; and estimate the source impedance of each equivalent source using one or more of the calculated line impedance and the calculated section impedances, and the two bus impedances.

15. The device of claim 14, wherein the signal processing unit is configured to calculate each bus impedance by multiplying the bus impedance with a correction factor, wherein the correction factor is calculated using a ratio of a fault voltage and the calculated fault current, and shunt admittances of the line sections, wherein the fault voltage is calculated using the estimated fault location, and the shunt admittances are calculated using the estimated fault location and the line parameters, optionally wherein the signal processing unit is configured to estimate the source impedance by removing contribution of shunt admittance, wherein the contribution of shunt admittance is calculated using one or more of the shunt admittance of the at least one transmission line, and the shunt admittances of the line sections calculated using on the fault location and the line parameters.

16. The device of claim 10, wherein the device is a substation server, optionally wherein the substation server is communicatively coupled with one or more measurement equipment and the switching devices; or wherein the device is an intelligent electronic device associated with a terminal of the one or more transmission lines, and communicatively coupled with another intelligent electronic device associated with another terminal of the one or more transmission line.

17. The device of claim 11, wherein the device is a substation server, optionally wherein the substation server is communicatively coupled with one or more measurement equipment and the switching devices; or wherein the device is an intelligent electronic device associated with a terminal of the one or more transmission lines, and communicatively coupled with another intelligent electronic device associated with another terminal of the one or more transmission line.

18. The device of claim 12, wherein the device is a substation server, optionally wherein the substation server is communicatively coupled with one or more measurement equipment and the switching devices; or wherein the device is an intelligent electronic device associated with a terminal of the one or more transmission lines, and communicatively coupled with another intelligent electronic device associated with another terminal of the one or more transmission line.

19. The device of claim 13, wherein the device is a substation server,
optionally wherein the substation server is communicatively coupled with one or more measurement equipment and the switching devices; or
wherein the device is an intelligent electronic device associated with a terminal of the one or more transmission lines, and communicatively coupled with another intelligent electronic device associated with another terminal of the one or more transmission line.

20. The device of claim 14, wherein the device is a substation server,
optionally wherein the substation server is communicatively coupled with one or more measurement equipment and the switching devices; or
wherein the device is an intelligent electronic device associated with a terminal of the one or more transmission lines, and communicatively coupled with another intelligent electronic device associated with another terminal of the one or more transmission line.

21. The method of claim 1, wherein the one or more transmission lines are two or more transmission lines, including a first transmission line and a second transmission line wherein the disturbance is a fault on the second transmission line, and wherein estimating the source impedance of each equivalent source comprises calculating:

$$Z_{sM} = \frac{-b + \sqrt{b^2 - 4ac}}{2a}$$

$$Z_{sN} = \frac{(Z_{par} + Z_{sM})Z_{MF} - \frac{Z_{l2}}{\left(\frac{Z_{sum}}{Z_l}\right)}Z_{sM}}{Z_{sM} - Z_{MF}}$$

wherein $$a = Z_{MF} - Z_{NF} - \frac{Z_{l2}}{(Z_{sum}/Z_l)}$$

$$b = Z_{par}Z_{MF} + \frac{Z_{l1}}{(Z_{sum}/Z_l)}(Z_{MF} - Z_{NF}) - \frac{Z_{l1}Z_{l2}}{(Z_{sum}/Z_l)^2}$$

$$c = \frac{Z_{l1}}{(Z_{sum}/Z_l)}Z_{par}Z_{MF}$$

and wherein $Z_{sM}$ is the source impedance of the equivalent source associated with a first one of the at least two substations, $Z_{sN}$ is the source impedance of the equivalent source associated with a second one of the at least two substations, $Z_{MF}$ is a bus impedance for the first substation, $Z_{NF}$ is the bus impedance for the second substation, $Z_l$ is line impedance on the first transmission line, $Z_{l1}$ is line impedance on a first section of the second transmission line, $Z_{l2}$ is line impedance on a second section of the second transmission line, is a $Z_{sum}$ of line impedances, and $Z_{par}$ is an impedance parameter that is based on the line impedances and $Z_{sum}$.

22. The method of claim 1, wherein the event is a switching event of a shunt element, and wherein estimating the source impedance of each equivalent source comprises calculating:

$$Z_{sM} = \frac{Z_{MF}}{1 + \frac{I_M^O - I_M^I}{I_{inj}}}$$

$$Z_{sN} = \frac{Z_{NF}}{1 + \frac{I_N^O - I_N^I}{I_{inj}}}$$

wherein $Z_{sM}$ is the source impedance of the equivalent source associated with a first one of the at least two substations, $Z_{sN}$ is the source impedance of the equivalent source associated with a second one of the at least two substations, $Z_{MF}$ is a bus impedance for the first substation, $Z_{NF}$ is the bus impedance for the second substation, $I_M^O$ is a steady state value of current at the first substation, $I_M^I$ is a value of the current at the first substation after the event, $I_N^O$ is a steady state value of current at the second substation, $I_N^I$ is a value of the current at the second substation after the event, and $I_{inj}$ is injected current.

* * * * *